United States Patent
Semcer, Sr. et al.

(10) Patent No.: US 8,737,089 B2
(45) Date of Patent: May 27, 2014

(54) LEAD FRAMES FOR CAPACITORS

(75) Inventors: Frank J. Semcer, Sr., Far Hills, NJ (US); Steven G. Santoro, Green Brook, NJ (US); James McClintock, Greenville, SC (US); Frank J. Jankoski, Jr., Alpha, NJ (US)

(73) Assignee: Micro Stamping Corporation, Somerset, NJ (US)

( * ) Notice: Subject to any disclaimer, the term of this patent is extended or adjusted under 35 U.S.C. 154(b) by 224 days.

(21) Appl. No.: 13/245,079

(22) Filed: Sep. 26, 2011

(65) Prior Publication Data
US 2012/0075828 A1   Mar. 29, 2012

Related U.S. Application Data

(60) Provisional application No. 61/386,678, filed on Sep. 27, 2010.

(51) Int. Cl.
 *H05K 5/02* (2006.01)
 *H05K 7/18* (2006.01)
 *H05K 7/00* (2006.01)
 *H01L 23/495* (2006.01)

(52) U.S. Cl.
 USPC ............ 361/813; 361/821; 174/529; 174/536

(58) Field of Classification Search
 USPC ............ 361/15, 287, 296, 298.2, 301.4, 303, 361/305, 723, 766, 767, 768, 770, 771, 782, 361/813, 820, 821, 299.2, 299.3, 298.4, 361/307, 308, 310, 772, 773, 774, 776; 174/529, 536, 528, 530, 531, 532, 533, 174/534, 535, 540, 551, 557
 See application file for complete search history.

(56) References Cited

U.S. PATENT DOCUMENTS

| | | | |
|---|---|---|---|
| 3,839,660 A | 10/1974 | Stryker | |
| 4,141,029 A | 2/1979 | Dromsky | |
| 4,556,896 A | 12/1985 | Meddles | |
| 6,245,448 B1 * | 6/2001 | Abbott | 428/670 |
| 7,429,801 B2 * | 9/2008 | Adamson et al. | 290/1 R |
| 2012/0168810 A1 * | 7/2012 | Kobayashi et al. | 257/99 |

FOREIGN PATENT DOCUMENTS

| | | | |
|---|---|---|---|
| JP | 06196349 A * | 7/1994 | |
| JP | 2005002400 A * | 1/2005 | |

* cited by examiner

*Primary Examiner* — Hoa C Nguyen
*Assistant Examiner* — Binh Tran
(74) *Attorney, Agent, or Firm* — Norris McLaughlin & Marcus, P.A.

(57) ABSTRACT

A Ferritic stainless steel, non Ferritic stainless steel or carbon steel based lead frame and method for producing same is provided. The lead frame is preferably used for TantalumNiobium capacitors but could possibly be applicable to other integrated circuits with the same operating parameters. Any reference to Tantalum capacitors in this application applies equally to Niobium capacitors unless otherwise noted. The lead frame is prepared by choosing one of Ferritic stainless steel, non Ferritic stainless steel or carbon steel as a base metal and rolling it to a final required thickness. The base metal is then preferably plated with a nickel strike or other conventional barrier layer and then with final outer plating layers(s). The exact thickness and choice of layering varies and can be tailored to meet the requirements of each lead attach process.

11 Claims, 1 Drawing Sheet

LEAD FRAMES FOR CAPACITORS

CROSS REFERENCE TO RELATED APPLICATION

This application claims the benefit of U.S. Provisional Patent Application No. 61/386,678, filed Sep. 27, 2010, the entirety of which is hereby incorporated by reference into this application.

BACKGROUND OF THE INVENTION

1. Field of the Invention

The present invention relates to tantalum and niobium capacitors. More specifically the present invention is related to lead frames for tantalum and niobium capacitors.

2. Description of Related Art

In the manufacture of passive integrated circuit devices, lead frames are used to provide electrical interconnection to a semiconductor circuit. Lead frames are small metal articles that are employed to connect integrated circuits to devices in which they are used. For example, in the manufacture of a Tantalum or Niobium capacitor, the lead frame provides the physical and electrical connection from the Tantalum/Niobium capacitor pellet to the electronic circuit to which it is applied.

Another of the primary functions provided by the lead frame is to support the integrated circuit. For a Tantalum or Niobium capacitor, the lead frame provides the handling platform during the process of manufacturing the capacitor from assembly to packaging. In addition to supporting the integrated circuit, the lead frame provides connections through the encapsulation envelope. These connections are used to attach the integrated circuit (capacitor) to the device in which it performs. The Ta/Nb pellet is electrically connected to the lead frame, usually by resistance or laser welding of the Ta/Nb anode wire to the lead frame for the positive connection and with a Silver Loaded Epoxy between the cathode to the leadframe for the negative connection. After being electrically connected to the lead frame, the integrated circuit (capacitor pellet) is encapsulated with the leads on the lead frame extending through, the plastic encapsulant.

To perform optimally, the lead frame must be made of material having specific properties including one or more of following depending on the specific use: good electric conductivity which is necessary to transmit electrical impulses to and from the integrated circuit sufficient for the desired circuit/device performance; minimal thermal conductivity to prevent heat from board mounting from transmitting to the Ta/Nb pellet and damaging the dielectric or cathode material; strength and rigidity sufficient for the manufacturing handling process and to maintain it in the device in which it is employed; sufficient ductility to be capable of accepting precision forming the complex shape of the capacitor component while retaining sufficient strength to retain the component on the circuit board. For certain types of capacitors, certain properties are required. For example, for Tantalum and Niobium capacitors, lead frames must have the ability to weld to the Ta/Nb lead wire, the ability to be plated with the necessary barrier and final plating layers for attachment to the Ta/Nb pellet and to the circuit board during final application, and thermal expansion consistent with process design.

Lead frames must also be made of material that has good corrosion resistance to prevent corrosion during the fabrication stages of the capacitor and during the application on the circuit board. Tantalum or Niobium lead frames must also be low cost as capacitors are inexpensive, commodity electronic components.

Finding a material with all of these properties is difficult, and, as a result, on a commercial scale compromises are made.

To achieve all of these requirements, the Tantalum Capacitor lead frame typically consists of base metal, a plated barrier layer(s) between the base metal and final plated outer layer(s). Typical lead frame base materials used include Copper, Copper based alloys, Copper/Nickel and/or Nickel based alloys that are typically from about 0.003" to 0.010" thick (as opposed to about 0.010 to 0.015 for active capacitors). A barrier or mid-layer is often plated to the base material to allow suitable attachment of the Tantalum pellet. Typical barrier layers consist of Nickel, Copper and/or Silver that are approximately 2-50 micro inches in thickness for each layer. Finally, a plated outer layer functions to allow reliable attachment of the lead frame to the circuit board using a variety of attachment methods. The outer layer typically is one or more of Tin, Tin/lead, Gold, Silver, and Palladium The Cu, Cu alloy, Cu/Ni and/or Ni based alloys typically used as the base metal for the lead frame functions satisfactorily but is an expensive solution in the space for electronic components. It would be desirable to have a base material that provides the same functional properties, or better, of those metals conventionally used but at a lower cost.

SUMMARY OF THE INVENTION

The present invention provides a lower cost Ferritic stainless steel, non Ferritic stainless steel or carbon steel based lead frame and method for producing same. The inventive lead frame is preferably used for Tantalum/Niobium capacitors but could be compatible with other integrated circuits with the same operating parameters. Any reference to Tantalum capacitors in this application applies equally to Niobium capacitors unless otherwise noted.

The lead frame is prepared by choosing one of Ferritic stainless steel, non Ferritic stainless steel or carbon steel as a base metal and rolling it to a final required thickness. The base metal is then preferably plated with a nickel strike or other conventional barrier layer and then with final outer plating layers(s). The exact thickness and choice of layering varies and can be tailored to meet the requirements of each lead attach process. This invention provides lead frames of comparable or superior performance to traditional lead frames at a significantly lower cost.

Other aspects of the invention will be apparent to those of ordinary skill in the art in view of the disclosure provided herein.

BRIEF DESCRIPTION OF THE DRAWINGS

The following figures are for illustrative purposes only and are not intended to limit the scope of the present invention in any way.

DETAILED DESCRIPTION

A stainless steel based lead frame and method of manufacturing the same is described. Any type of stainless steel may be used, such as for example carbon steel and high iron bearing stainless steel. Throughout the application any reference to stainless steel includes, Ferritic stainless steel, non Ferritic stainless steel or carbon steel unless otherwise noted. The stainless steel based lead frame of the invention is particularly useful for Tantalum and Niobium capacitors due to a number of factors. First, stainless steel has the ability to reliably be plated with a layer that allows high conductivity and attachment to the circuit board. Stainless steel also has the ability to allow reliable attachment of the Ta/Nb anode wire via existing welding methods. Stainless steel also has poor heat transfer, thus reducing transfer of heat from the board mounting process to the Ta/Nb pellet. Finally, stainless steel provides a material set which is cost favorable to copper/nickel alloys.

Figure 1:
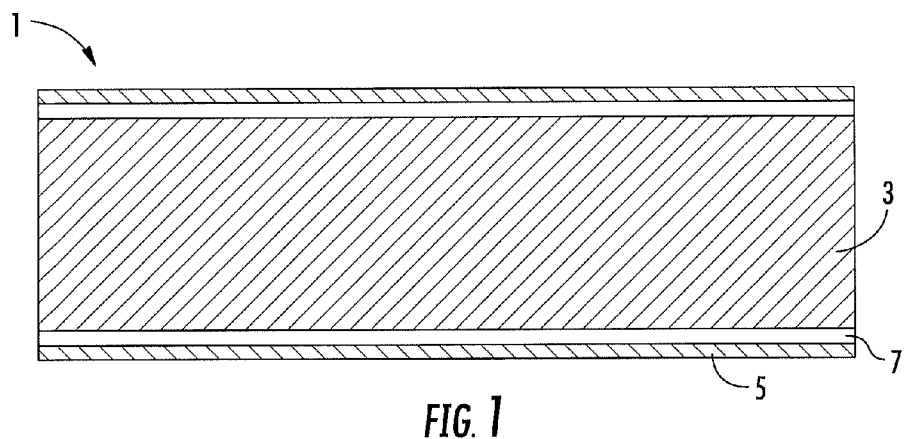
FIG. 1. is a cross section of one embodiment of a lead frame constructed in accordance with the present invention.

FIG. 1 a cross section of one embodiment of a lead frame 1 constructed in accordance with the present invention (drawing not to scale). A lead frame 1 is composed of a base 3 (otherwise referred to as a carrier strip or core) and an outer plating 5 (or functional electronic plating layer 5). In operation, the current flows through the outer plating 5 and not the base 3. The outer plating 5 will, in most embodiments, be on both sides of the base 3. However, outer plating 5 may be positioned on only one side depending on the desired end use of the lead frame 1. In between the base 3 and the outer plating 5 is a mid-layer or layers 7 (otherwise referred to as barrier layer 7). The inclusion of a mid-layer 7 or multiple mid-layers 7 is optional and the choice to include a mid-layer 7 and the material used will depend on the intended use and material used as the outer plating 5.

In one preferred embodiment, a high iron bearing stainless steel is used as the base 3 of the lead frame 1 onto which one or more additional layers are plated, i.e. barrier layers 7 and/or plating layers 5 (collectively "additional layers"). The one or more additional layers are plated directly onto the stainless steel base 3 with no further rolling or pressing. The additional layers must have a good bond strength, good electrical characteristics and good soldering characteristics for the final product. In the preferred embodiments, copper and the high nickel alloys are not required to be used for either base or any of the additional layers, thereby providing a very high performance, low cost lead frame 1.

While not a requirement, in most instances, a barrier layer 7 will be included because it is technically impractical place a functional electronic plated layer 5 directly on stainless steel. Various materials could be used but one preferable barrier layer 7 is nickel strike. Alternatively, gold or gold alloy can be used but it would increase the cost. The barrier layer 7 functions to provide electrical base over the stainless steel that can be plated over with other common electronic plating surfaces, i.e. outer plating 5, such as for example, copper, silver and either solder (tin/lead or pure tin). The exact combination of stainless steel 3, barrier layer 7 and functional electronic plating layer 5 will vary depending on the application.

Figure 2:
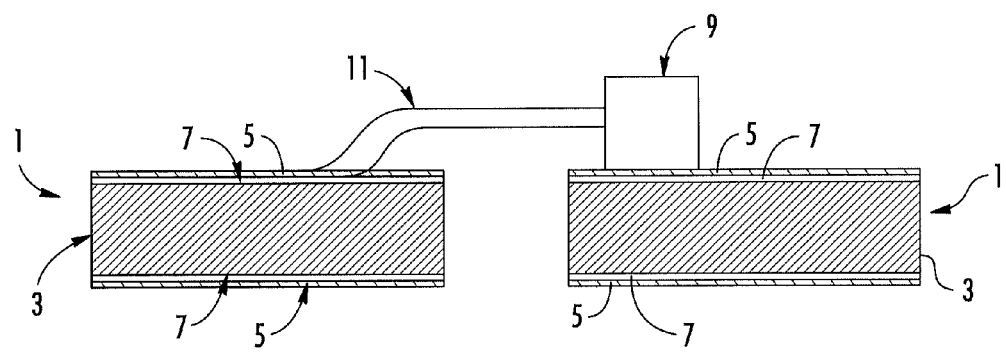
FIG. 2. is a side view of a lead frame constructed in accordance with the present invention connected to a capacitor.

FIG. 2 shows a lead frame 1 constructed in accordance with the invention connected to a capacitor 9. As in FIG. 1, a cross section of the lead frame 1 is shown. The outer plating 5 is connected to the capacitor 9 and anode 11 and functionally is the portion of the lead frame 1 in which the current flows. Accordingly, it is not necessary that the base or core 3 conduct electricity in the same way as the conventionally used copper or copper alloys. In fact the base need not have any special conductivity properties to properly function.

Stainless steel is the preferred material for the base for a number of reasons. Stainless steel has significantly lower thermal conductivity than conventional lead frame materials. This is advantageous because heat build-up in circuit boards and other electrical components can lead to failure, and therefore it is desired to have small values for thermal conductivity. Further stainless steel has good strength, high density, and very good corrosion resistance. The high density allows the production of lead frames using less material than conventional lead frames constructed with copper or a copper alloy. That is, the same amount of steel will make up to approximately 20% more lead frames than the same amount of copper.

In the preferred embodiment, the stainless steel base 3 is rolled to the final thickness prior to plating any layers. A bright, smooth, dense surface is not necessary and in some instances be detrimental for a Tantalum capacitor application.

In one preferred embodiment, the lead frame 1 is prepared by the following process. The base 3 is initially prepared by rolling stainless steel strip stock. Typically the strip stock is less than about 0.185 inches thick and under 24 inches wide. The strip normally is put through a pickling process that uses a nitric-hydrofluoric acid bath to de-scale the steel. A cold rolling process is then used to further reduce the thickness. The strip is annealed and de-scaled again. The frequency and timing of these annealing steps depends on the desired temper and hardness in the final product.

The stainless steel is cold rolled to the desired thickness and wound into a large coil. The stainless steel is rolled to at or near the desired final thickness of base 3, which in many applications will be from about 0.0040 inches thick. Slitting operations are usually used cut the wide 24 inch coil and obtain the desired strip width of the base 3. Slitting is a shearing process that can produce the strip width required for subsequent stamping process. This process puts the stainless steel at correct thickness, width and is layered in coil form that has sufficient linear feet. The next step is plating.

The coils of stainless steel are then placed on a rotary payoff to be dispensed at the required rate by the plating process. The coils are unwound and preferably pulled through an electrolytic alkali cleaning bath to remove any impurities on the surface of the stainless steel. The strip is then made to go through a plating bath of nickel where a thin layer of nickel (the barrier layer 7), often referred to nickel strike, is applied. Typically the barrier layer will be from about 0.00001 inches to 0.00008 inches thick per side. The nickel strike (barrier layer 7) is applied so that the tin (plating layer 5) will adhere to the stainless steel base material 3.

The strip (base 3 and barrier layer 7) is cleaned in sulfuric acid. Optionally, the stainless steel 3 with nickel strike 5 is sometimes put through a masking operation. The masking is normally a UV cured liquid which is print onto the strip in areas where no further plating is desired. The strip is then typically cleaned again in preparation for the plating layer 5 (in this instance tin). Masking and selective plating is not required in most cases and is an optional step in the process.

The strip (base 3 and barrier layer 7) is then fed through a pure tin plating bath where the desired thickness of tin is deposited on the strip or any unmasked portion of the strip. Typically, the tin is applied about 0.00015 inches to 0.00035 inches thick per side, but may be outside that range depending on the application. If required, the masking is then removed with a caustic cathode ink stripper exposing the bare nickel strike plating 7. The strip is rinsed and re-reeled into a coil state in preparation for stamping.

The coils of strip (now stainless steel, nickel strike and tin) are then placed on a rotary payoff to be dispensed at the required rate determined by the stamping process. The strip is pulled through rollers to remove any bow thereby straightening the material to a flat state. The strip is indexed into the stamping die at a precise length or pitch, by a feed mechanism. The stamping die, which has been mounted into a high speed stamping press is actuated by a reciprocating vertical motion of the press and is used to cut and form the stainless steel material.

The strip continues to be indexed progressively by the feed mechanism into the stamping die with each cycle or stroke of the press. After the cutting and forming operation, the lead frame 1 progresses through an automated cleaning or degreasing tank to remove any oils or cutting fluids that may be present on the material.

The choice the final plated layer will vary in both thickness of the layer or layers and the type of metal, alloy or other material used. The main consideration in choosing the layers will be the final application of the lead frame. Those layers used with traditional Cu, Cu based alloys, Cu/Ni and/or Ni based alloys can be used with equal success with the stainless steel bases as described herein.

There will be various modifications, adjustments, and applications of the disclosed invention that will be apparent to those of skill in the art, and the present application is intended to cover such embodiments. Accordingly, while the present invention has been described in the context of certain preferred embodiments, it is intended that the full scope of these exceed these preferred embodiments.

The invention claimed is:

1. A lead frame comprising: a base made of stainless steel or carbon steel, wherein the base has a thickness defined between a first side and a second side located opposite to the first side of the base, a first side of at least one barrier layer applied to the first side of the base, wherein the at least one barrier layer has a thickness defined between the first side of the at least one barrier layer and a second side of the at least one barrier layer located opposite to the first side of the at least one barrier layer, wherein the at least one barrier layer is made of another metal or alloy, and a first plating layer deposited onto the second side of the first barrier layer opposite to the base, wherein the first plating layer is an outermost layer of the lead frame and is made of tin or tin/lead; a first side of a second barrier layer applied to the second side of the base, wherein the second barrier layer has a thickness defined between the first side of the second barrier layer and a second side of the second barrier layer; a second plating layer deposited onto the second side of the second barrier layer opposite to the base.

2. The lead frame according to claim 1 wherein the first barrier layer and second barrier layer are made of nickel, nickel strike, gold or gold alloy.

3. The lead frame according to claim 1 wherein the first plating layer and the second plating layer are outermost layers of the lead frame and the second plating layer is made of one selected from the group consisting of copper, tin, tin/lead and silver.

4. A method comprising:
   connecting a capacitor to the lead frame according to claim 1.

5. The method according to claim 4, wherein an anode connects the capacitor and the lead frame according to claim 1.

6. The method according to claim 5, wherein an end of the anode is connected to the first outer plating of the lead frame according to claim 1.

7. The method according to claim 6, further comprising:
   flowing electrical current through the first outer plating of the lead frame according to claim 1.

8. A capacitor comprising a tantalum or niobium capacitor pellet; and a lead frame, wherein the lead frame comprises a base made of stainless steel or carbon steel and having a thickness defined between a first side and a second side located opposite to the first side of the base; a first barrier layer plated directly onto the first side of the base, wherein the first barrier layer is made of another metal; and a first outer plating deposited onto the first barrier layer opposite to the base, wherein the first outer plating is an outermost layer of the lead frame and comprises copper, silver, tin or tin/lead; a second barrier layer plated directly onto the second side of the base, wherein the second barrier layer is made of a metal; and, optionally, a second outer plating deposited onto the second barrier layer opposite to the base.

9. The capacitor according to claim 8 wherein the base is rolled to the final thickness prior to the plating of the one or more layers.

10. The capacitor according to claim 8 wherein the first barrier layer is made of nickel, nickel strike, gold or gold alloy.

11. The capacitor according to claim 8, wherein the second outer plating is deposited onto the second barrier layer and is made of one selected from the group consisting of copper, silver, tin and tin/lead.

* * * * *